United States Patent [19]
Flohrs

[11] Patent Number: 4,618,875
[45] Date of Patent: Oct. 21, 1986

[54] DARLINGTON TRANSISTOR CIRCUIT

[75] Inventor: Peter Flohrs, Reutlingen, Fed. Rep. of Germany

[73] Assignee: Robert Bosch GmbH, Stuttgart, Fed. Rep. of Germany

[21] Appl. No.: 525,031
[22] PCT Filed: Dec. 30, 1982
[86] PCT No.: PCT/DE82/00234
 § 371 Date: Aug. 8, 1983
 § 102(e) Date: Aug. 8, 1983
[87] PCT Pub. No.: WO83/02528
 PCT Pub. Date: Jul. 21, 1983

[30] Foreign Application Priority Data

Jan. 20, 1982 [DE] Fed. Rep. of Germany ... 8201186[U]
Jul. 23, 1982 [DE] Fed. Rep. of Germany ....... 3227536

[51] Int. Cl.$^4$ ............... H01L 27/02; H01L 29/34; H03K 3/26
[52] U.S. Cl. .................................. 357/46; 357/52; 357/51; 307/315
[58] Field of Search ............... 357/46, 52, 51, 53; 307/315

[56] References Cited

U.S. PATENT DOCUMENTS

| 3,243,669 | 3/1966 | Sah. | |
|---|---|---|---|
| 3,510,735 | 5/1970 | Potter | 357/51 |
| 3,845,495 | 10/1974 | Cauge et al. | 357/23 |
| 3,858,235 | 12/1974 | Schild | 357/35 |
| 4,037,245 | 7/1977 | Ferro | 357/38 |
| 4,106,048 | 8/1978 | Khajezadeh | 357/40 |
| 4,157,563 | 6/1979 | Bosselaar | 357/53 |
| 4,167,748 | 9/1979 | D'Angelo et al. | 357/46 |
| 4,312,011 | 1/1982 | Kanbayashi | 357/46 |
| 4,437,107 | 3/1984 | Jonsson et al. | 357/52 |
| 4,482,911 | 11/1984 | Quoirin | 357/46 |
| 4,564,771 | 1/1986 | Flohrs | 307/315 |

FOREIGN PATENT DOCUMENTS

| 6413894 | 8/1965 | Netherlands. | |
| 1348697 | 3/1974 | United Kingdom. | |
| 2061655 | 5/1981 | United Kingdom | 357/46 |

OTHER PUBLICATIONS

Novel IC Structure for 150V High-Voltage Consumer IC, Ichiro Imaizumi et al—8087 IEEE Trans. on Consumer Electronics, Vol. CE-26, (1980), Aug., No. 3, New York, USA, pp. 367-374.

Primary Examiner—Martin H. Edlow
Assistant Examiner—Terri M. Henn
Attorney, Agent, or Firm—Frishauf, Holtz, Goodman & Woodward

[57] ABSTRACT

A Darlington transistor circuit having a power transistor and a driver transistor is proposed. The two transistors are monolithically integrated in a common substrate (10) by a planar process, the substrate forming the collector zones of the two transistors. On the main surface of the substrate (10) there is a passivation layer (13) covering this main surface with the exception of contact windows. The base-collector junctions of the two transistors are protected by a metal electrode (15), which is located above the passivation layer (13) and extends up to a stop ring (14), which is disposed beneath the passivation layer (13) in the substrate (10). The potential at the cover electrode (15) is adjustable with the aid of a voltage divider (16). (FIG. 3).

12 Claims, 9 Drawing Figures

DARLINGTON TRANSISTOR CIRCUIT

BACKGROUND

The invention relates generally to a Darlington transistor circuit, and more particularly to a monolithic integrated version thereof.

Circuits of this kind are already known. However, they have the disadvantage that electrical fields acting upon them from outside, such as are produced by the polarization of photoresist coatings during operation at high voltage and temperature, can cause the degradation of blocking-state characteristic curves, or else that the breakdown voltage can be influenced within certain limits only by varying the thickness of the passivation layer but is not variable after the metallizing coating has been applied.

THE INVENTION

Briefly, the Darlington transistor circuit according to the invention features a cover electrode over the doped semiconductor material and a passivation layer insulating the cover electrode from the semiconductor junctions and has the advantage over the prior art that the space charge zone forming around the first and second zones during operation is limited to inside the annular zone serving as a stop ring and underneath the cover electrode is shielded from external electrical fields. A further advantage is that the breakdown voltage at the first and second p-n junctions is variable within wide limits. Providing indirect connections between the cover electrode, a common collector portion of the semiconductor material, and one of the base zones in the semiconductor material affords a particularly simple opportunity for realizing the setting of this breakdown voltage with the aid of a voltage divider. Particularly advantageous further developments of the subject of claims 1 and 2 are disclosed in the further dependent claims 3-12.

DRAWING

Exemplary embodiments of the Darlington transistor circuit according to the invention are shown in the drawing and explained in greater detail in the ensuing description. Shown are:

FIG. 1, the electrical circuit diagram of a known Darlington transistor circuit comprising two n-p-n transistors;

FIG. 2, a section taken through the layout of a Darlington transistor circuit according to FIG. 1;

FIG. 3, a partial section through a Darlington transistor circuit according to the invention, having an external ohmic voltage divider for adjusting the breakdown voltage at the first and second p-n junctions;

FIG. 4, the breakdown voltage $U_{Br}$ at the first p-n junction in accordance with the divider ratio of this external voltage divider;

FIG. 5, a plan view on a Darlington transistor circuit according to the invention, in which the ohmic voltage divider is monolithically integrated, having closed contact windows;

FIG. 6, a plan view on the disposition of FIG. 5, but with opened contact windows;

FIG. 7, a section taken along the line A-A' of FIG. 6;

FIG. 8, a plan view on a portion of a Darlington transistor circuit according to the invention, in which the ohmic voltage divider is partially replaced by a chain of Zener diodes; and FIG. 9, a section taken along the line B-B' of FIG. 8.

DESCRIPTION OF THE EXEMPLARY EMBODIMENTS

Figure 1:
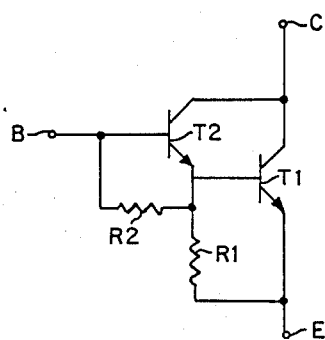

FIG. 1 shows the electrical circuit diagram of a Darlington transistor circuit having an n-p-n power transistor $T_1$ and an n-p-n driver transistor $T_2$ and with respective resistors $R_1$ and $R_2$ parallel to the emitter-base paths of these two transistors.

Figure 2:
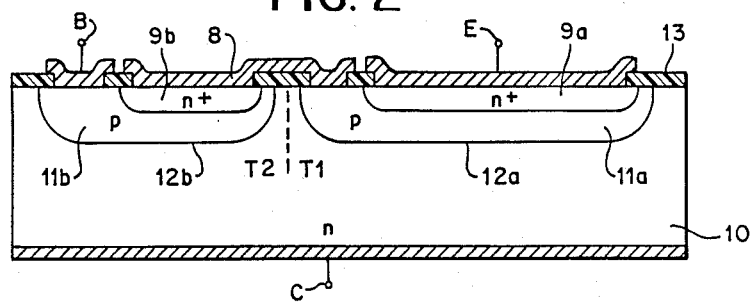

In FIG. 2, a section through the layout of a Darlington transistor circuit according to FIG. 1 is shown. In the common n-conductive semiconductor substrate 10, the two p-conductive base zones 11a and 11b of the two transistors $T_1$, $T_2$ are diffused in from a main surface. These zones, together with the semiconductor substrate 10, form p-n junctions 12a and 12b. From the same main surface, the corresponding n-conductive emitter zones 9a and 9b of the two transistors $T_1$, $T_2$ are diffused into the zones 11a and 11b. A passivation layer 13 covers those parts of this main surface at which p-n junctions meet the surface. The external connections of the Darlington transistor circuit are marked E, B and C, as in FIG. 1, with E being the emitter connection, B the base connection and C the collector connection. Between the metallizing coating for the emitter connection E and the metallizing coating for the base connection B, on this same main surface, there is a connecting metallizing coating 8 for connecting the emitter zone 9b of the driver transistor $T_2$ with the base zone 11a of the power transistor $T_1$.

The planar p-n junctions 12a and 12b are now supposed to be protected by a metal electrode 15 via the insulator 13 such that the blocking behavior cannot be affected undesirably by external influences (such as substances having polar groups, alkali ions, metal flakes and so forth).

Figure 3:
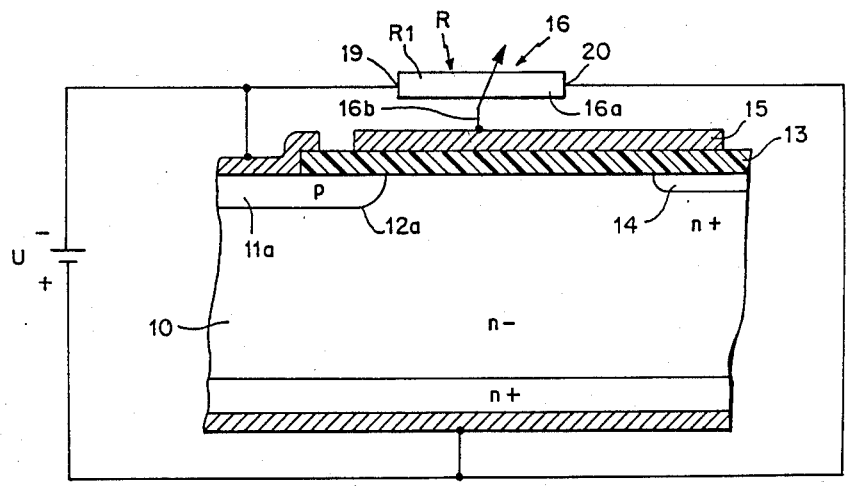

FIG. 3 shows an exemplary embodiment in a schematic illustration. The substrate 10 is of $n^-$-conductive silicon, and the insulator 13 is of thermally grown silicon dioxide. The metal electrode 15 overlaps the p zone 11a and the p zone 11b (not shown) as well as an $n^+$ region 14, which is diffused in simultaneously with the emitters of the two transistors $T_1$ and $T_2$. The $n^+$-conductive emitter zone 9a of the n-p-n transistor $T_1$ is not shown in FIG. 3, however. The attainable breakdown voltage at the p-n junctions 12a and 12b depends not only on the basic doping of the silicon but also, substantially, on the thickness of the oxide layer 13 and on the potential of the electrode 15.

Figure 4:
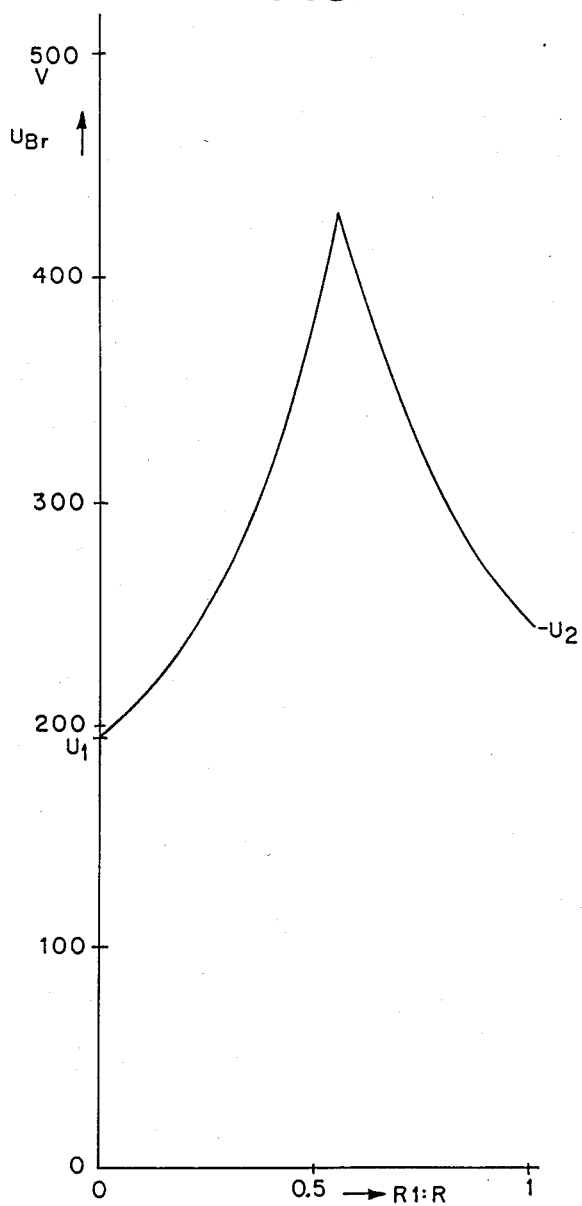

FIG. 4 shows the dependency of the breakdown voltage as a function of the divider ratio $R_1:R$ of an external voltage divider 16. $U_1$ is the breakdown voltage at the p-n junction 12a which is obtained if the cover electrode 15 is connected directly to the p zone 11a, without the interposition of the resistor $R_1$. In the present example, $U_1$ is markedly lower than the breakdown voltage attainable without a cover electrode 15. It is equal to the voltage at the depletion breakdown of a corresponding MOS structure. $U_2$ is the breakdown voltage obtained if the cover electrode 15, dispensing with the voltage divider 16, is connected to the $n^+$ region 14 or to the common collector zone of the two n-p-n transistors $T_1$ and $T_2$. Because of the increase in field intensity dictated by the charge carrier enrichment, $U_2$ is likewise lower than the breakdown voltage without a cover electrode 15. The highest attainable breakdown voltage amounts to $U_1+U_2$, at a divider ratio of $R_1:R=U_2:(U_1+U_2)$. The temperature range of the breakdown voltage is somewhat smaller in a transistor than in a Zener diode with the same blocking voltage, especially if the voltage divider 16 is adjusted to the right flank of the voltage curve in FIG. 4.

Figure 5:
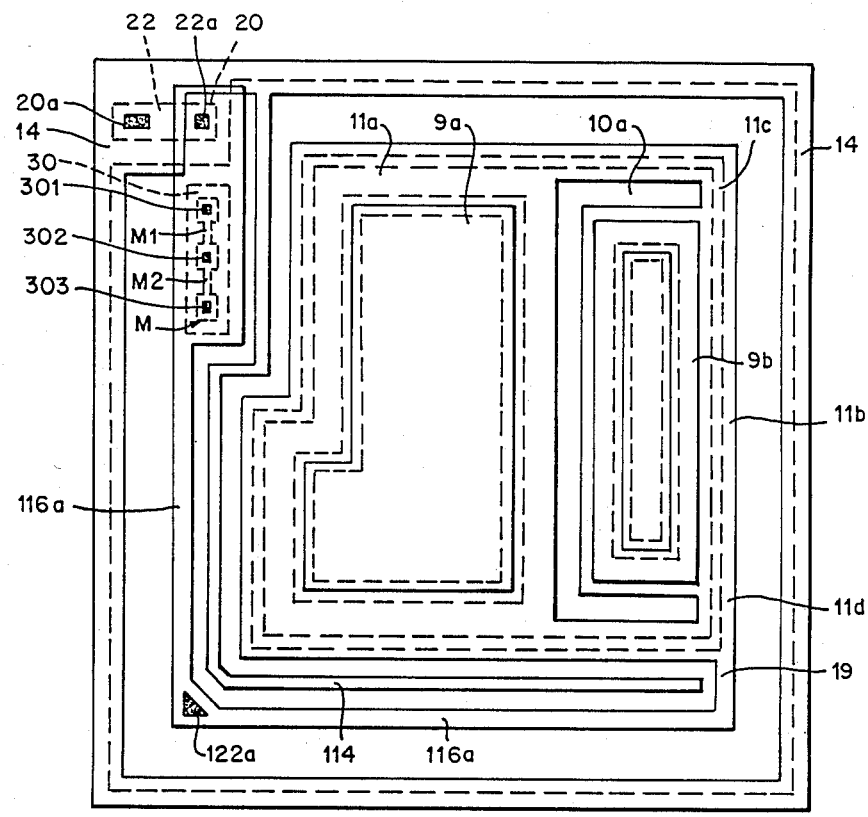
Figure 6:
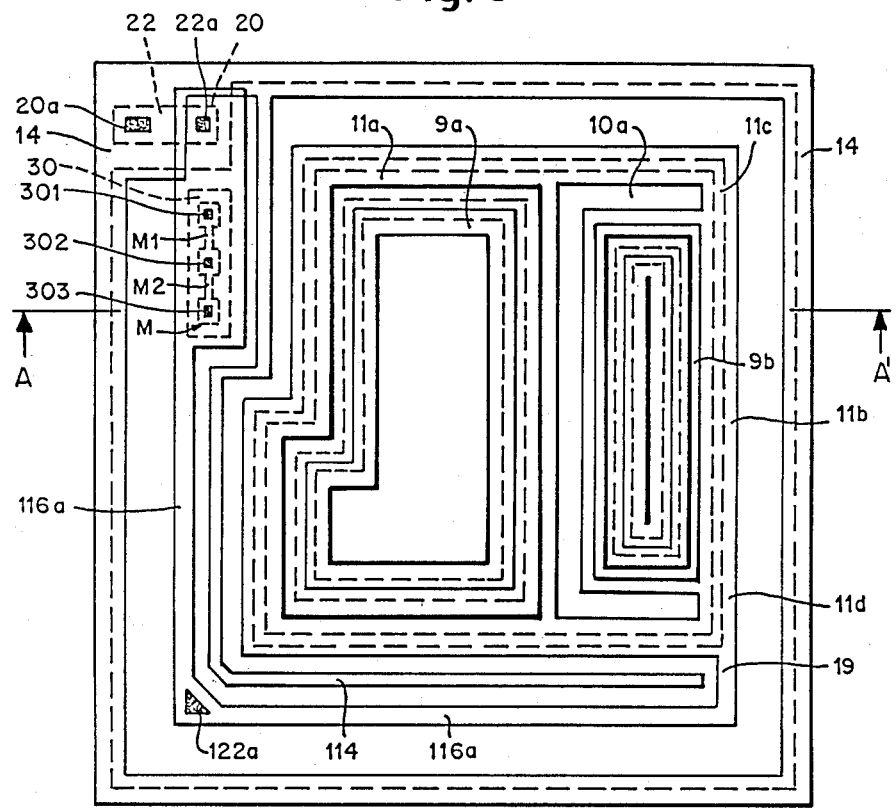
Figure 7:
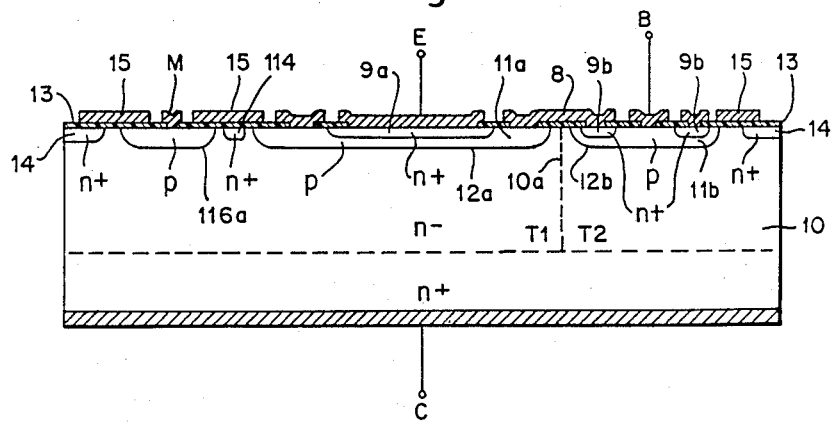

FIGS. 5 and 7 show one example of how the voltage divider 16 can be monolithically integrated. As shown by the plan view in FIG. 5, the voltage divider resistor 16a forms an elongated p-conductive zone 116a diffused in from the main surface of the substrate 10. This zone 116a comprises an extension of the second zone 11b and is covered at least partially by the passivation layer 13 and by the metallizing coating extending beyond it and serving as the cover electrode 15. The edge of all the metallizing coatings is indicated in FIGS. 5 and 6 by dashed lines. At a specific location over the zone 116a, the passivation layer 13 under the cover electrode 15 is removed. The portion of the cover electrode 15 coming to rest inside the thus-formed contact window 122a thereby forms the tap 16b of the voltage divider 16. The first end 19 of the voltage divider resistor 16a is located at the lower right corner of the second zone 11b in FIGS. 5 and 6 and establishes an uninterrupted transition from the second zone 11b to the elongated zone 116a. It would also be conceivable, and in certain applications advantageous as well, to provide a direct connection of the zone 116a with the zone 11a. The second end 20 of the voltage divider resistor 16a is formed by the other end of the zone 116a, which in FIGS. 5 and 6 is located somewhat to the right of the lower left corner of the substrate 10. This second end 20 of the voltage divider resistor 16a formed by the zone 116a is connected in such a manner with the stop ring 14, by means of a metallizing coating 22 extended beyond the passivation layer 13, that this metallizing coating 22 is bonded, via contact windows 22a disposed in the passivation layer 13, to the regions located beneath them which are to be connected with one another.

Above the upper left portion of the zone 116a, a recess which exposes the passivation layer 13 is disposed in the cover electrode 15. Contact windows 301, 302, 303 are introduced into the portion of the passivation layer 13 exposed by the recess 30 and extend in a row in the longitudinal direction of the elongated zone 116a. These contact windows 301, 302, 303 are bridged over by the short-circuit metallizing coating M, which short-circuits the portions of the third zone 116a located between these contact windows 301, 302, 303. The voltage divider 16 can be calibrated by splitting off individual parts $M_1$, $M_2$ of this short-circuit metallizing coating M, in order to be able to set the breakdown voltages at the p-n junctions 12a and 12b to a desired value. A suitable method for splitting off metallizing bridges of this kind is described in German Examined Application DE-AS No. 22 56 688.

With the disposition shown in FIGS. 5–7, the overall result attained is that all the regions bordering on the main surface discussed above, in which space charging takes place when a blocking voltage is applied to the p-n junctions 12a, 12b—that is, essentially regions of zone 10 and an adjacent strip of zones 11a, 11b—are protected by means of a metallic cover electrode 15 located over the silicon dioxide layer 13.

A C-shaped part 10a of zone 10, which partially separates the base zones 11a, 11b of the power and driver transistors from one another can be covered, without any disadvantageous effect on blocking ability, by the metallizing coating 8, which is connected to the base zone of the power transistor $T_1$ and to the emitter zone of the driver transistor $T_2$.

Two webs 11c and 11d which are of base material and connect the zones 11a and 11b with one another act as a resistor between the base zones 11a and 11b of the two transistors $T_1$ and $T_2$ which is labelled $R_2$ in FIG. 1. Should this resistor not be desired, then the C-shaped zone 10a can be extended to form a ring, which is likewise capable of being protected completely by a covering metallizing coating.

For the sake of simplicity, details which have nothing to do with the concept of the invention have not been shown. Such details are, for instance, the serrations of emitter zones, a resistor $R_1$ between the emitter and the base of the power transistor $T_1$, a diode parallel to the emitter-collector path of the power transistor $T_1$ and an overlapping of the emitter-base junctions on the part of the metallizing coating.

In FIGS. 5 and 6, in the area around the metal strip 22, the boundary of the $n^+$ zone is selected such that the $n^-$ zones (zone 10) are covered completely everywhere, even at the less-critical points, by the metal electrode 15.

An $n^+$ strip 114, which communicates with zone 14, is located between the p zone 11a or 11b, respectively (the base zone) and the p zone 116a (voltage divider resistor). This strip 114 prevents the establishment of a connection between the zones 11a, 11b and the zone 116a via the space charge if a blocking voltage is applied to the p-n junctions 12a and 12b.

In order to attain high voltage divider resistances while requiring little surface area, it is recommended that an additional photo process be provided for the zone 116a of the voltage divider, in order to undertake a lesser doping of impurities independently of the base zones 11a and 11b.

Figure 8:
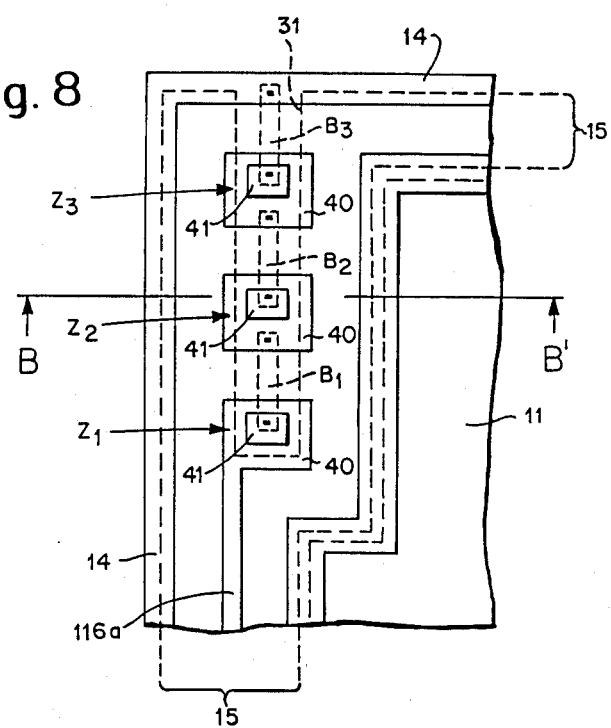
Figure 9:
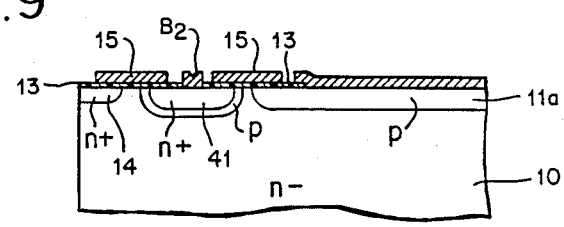

In the exemplary embodiment of FIGS. 8 and 9, the portion located in the upper left corner of FIGS. 5 and 6 of the ohmic voltage resistor 16a formed by the zone 116a is replaced by a chain of Zener diodes $Z_1$, $Z_2$, $Z_3$. These Zener diodes each comprise a zone 40 of p-type conductivity diffused into the main surface of the substrate 10 and a zone 41 of $n^+$-type conductivity diffused into this zone 40. In the vicinity of the Zener diodes $Z_1$, $Z_2$, $Z_3$ a tongue-like recess 31 is provided in the metallizing coating 15, and the Zener diodes $Z_1$, $Z_2$, $Z_3$ are connected with one another inside this recess 31 by means of metallizing bridges $B_1$, $B_2$. Inside the recess 31, the last Zener diode $Z_3$ of the chain $Z_1$, $Z_2$, $Z_3$ is furthermore connected, by means of a further metallizing bridge $B_3$, with a portion of the stop ring 14. The connections are each realized such that the metallizing bridges $B_1$, $B_2$, $B_3$ are bonded via contact windows disposed in the passivation layer 13 to the corresponding areas located beneath them.

In the exemplary embodiment shown in FIGS. 8 and 9, in which a portion of the ohmic voltage divider resistor 16a has been replaced by a chain of Zener diodes $Z_1$, $Z_2$, $Z_3$, the p-conductive zones 40 of these Zener diodes are diffused in at the same time as the p zones 11a and 11b and the p zone 116a; the $n^+$ zones 41 are diffused in simultaneously with the $n^+$ zone 14 and the $n^+$-conductive emitter zones 9a, 9b of the two transistors $T_1$ and $T_2$. The breakdown voltage of the Zener diodes $Z_1$, $Z_2$, $Z_3$ is on the order of magnitude of 10 volts.

In order to adjust the blocking voltage of the main junctions 12a and 12b, the Zener diodes $Z_1$, $Z_2$, $Z_3$ can be short-circuited individually, perhaps by the brief application of a high blocking voltage, combined with a high blocking current.

Naturally the number of calibration paths is not limited to that of the exemplary embodiment shown. The calibration processes described can also be combined with one another as needed.

I claim:

1. An external-field-insensitive Darlington transistor circuit, with adjustable junction breakdown voltage, having a power transistor (T1) and having a driver transistor (T2), the collector of which driver transistor is connected to the collector of the power transistor (T1) and the emitter of which driver transistor is connected to the base of the power transistor (T1), and in which circuit the power transistor (T1) and the driver transistor (T2) are monolithically integrated by a planar process in a common substrate (10) forming the collector zones of the two transistors (T1, T2), wherein a first (11a) and a second zone (11b) are diffused into the substrate (10) from a main surface, the substrate (10) having a specified conductivity type and the first (11a) and second (11b) zones having the opposite conductivity type, said first and second zones (11a, 11b) respectively forming with the material of the substrate (10) a first (12a) and a second (12b) p-n junction and the base zones of the two transistors (T1, T2), wherein, from the same main surface of the substrate (10), an emitter zone, having the same conductivity type as the basic material of the substrate (10) but a higher concentration of impurities, is diffused into each of said first and second base zones (11a, 11b), said emitter zones serving as the emitter zones (9a, 9b) of the respective transistors, and wherein a substantially non-conductive passivation layer (13) covering this same main surface of the substrate (10), except for contact windows, is provided, comprising a further annular zone (14), serving as a stop ring, diffused into the substrate (10) from the same main surface around the first (11a) and second (11b) base zones, said annular stop ring zone (14) having the same conductivity type as the basic material of the substrate (10) but a higher concentration of impurities;

a metal coating, serving as a cover electrode (15) and as a shield against external electric fields, applied atop the passivation layer (13), said metal coating (15) extending over a region between the base zones (11a, 11b) and the annular stop ring zone (14), and overlapping not only the annular stop ring zone (14), but also portions of the base zones (11a, 11b) adjacent to the annular stop ring zone (14), and a voltage divider (16) monolithically integrated with said power (T1) and driver (T2) trransistors in said circuit, for adjusting the potential of the cover electrode (15) to a value dependent upon the desired breakdown voltage of the first and second p-n junction (12a, 12b), which value falls in a range defined by the potential of the first base zone (11a) and the potential of a portion of the substrate (10) located outside the first (11a) and second (11b) zones and having a conductivity type opposite from that of the first (11a) and second (11b) base zones, said voltage divider (16) including a voltage divider resistor (16a) and a tap (16b), and wherein the tap (16b) is connected to the cover electrode (15), the first end (19) of the voltage divider resistor (16a) is connected with one of the first zone (11a) and the second zone (11b), and the second end (20) of the voltage divider resistor (16a) is connected on a surface of said integrated circuit with a portion of the substrate (10) located outside the first (11a) and second (11b) zones, which portion has a conductivity type opposite from that of the first (11a) and second (11b) zones, whereby said breakdown voltage can be adjusted, after fabrication of said integrated circuit, by varying where, on the surface thereof, one of said ends of said voltage divider resistor (16a) is connected.

2. A Darlington transistor circuit as defined by claim 1, characterized in that the voltage divider resistor (16a) includes at least one ohmic resistor.

3. A Darlington transistor circuit as defined by claim 2, characterized in that the voltage divider resistor (16a) includes an elongated zone (116a) diffused into the substrate (10) from the same main surface and having the same conductivity type as the first (11a) and the second (11b) zone, wherein the elongated zone (116a) forms an extension of the first (11a) or the second (11b) zone and is covered at least partially by the passivation layer (13) and by the metallizing coating extending over and beyond it and serving as the cover electrode (15), and that at a specific location above the elongated zone (116a) the passivation layer (13) is removed underneath the metallizing coating serving as the cover electrode (15), whereupon the portion of the cover electrode (15) coming to be located inside the thus-formed contact window (122a) forms the tap (16b) of the voltage divider (16).

4. A Darlington transistor circuit as defined by claim 3, characterized in that the voltage divider (16) is a purely ohmic voltage divider and that the elongated zone (116a) forms the entire voltage divider resistor (16a).

5. A Darlington transistor circuit as defined by claim 4, characterized in that the second end (20) of the voltage divider resistor (16a) formed by the elongated zone (116a) is connected in such a manner, by means of a metallizing coating (22) extended over and beyond the passivation layer (13), with a portion of the substrate (10) which has a conductivity type opposite from that of the first (11a) and the second (11b) zones, preferably with a portion of the stop ring (14), that this metallizing coating (22) is bonded via contact windows (22a) disposed in the passivation layer (13) to the regions (20, 14) located therebeneath and which are to be connected with one another.

6. A Darlington transistor circuit as defined claim 3, characterized in that over a portion of the elongated zone (116a) in the metallizing coating serving as the cover electrode (15), a recess (30) is disposed which exposes the passivation layer (13), that contact windows (301, 302, 303) are introduced into the portion of the passivation layer (13) exposed by the recess (30), which contact windows extend in a row in the longitudinal direction of the elongated zone (116a), that these contact windows (301, 302, 303) are bridged over by a short-circuit metallizing coating (M), which short-circuits the portions of the elongated zone (116a) located between the contact windows (301, 302, 303), and that the voltage divider (16) is calibratable by the splitting off of individual portions ($M_1$, $M_2$) of this short-circuit metallizing coating (M), in order to adjust the breakdown voltage at the first p-n junction (12a) to a desired value.

7. A Darlington transistor circuit as defined by claim 2, characterized in that the voltage divider resistor (16a) comprises an ohmic resistor and a chain of Zener diodes ($Z_1$, $Z_2$, $Z_3$) connected in series with this resistor and with one another.

8. A Darlington transistor circuit as defined by claim 3, characterized in that the Zener diodes ($Z_1$, $Z_2$, $Z_3$) each comprise a zone (40) diffused into the same main surface of the substrate (10) and having the same conductivity type as the first (11a) and the second (11b) zones and a zone (41) diffused into this zone (40) and having the same conductivity type as the basic material of the substrate (10) but a higher concentration of impurities, that in the vicinity of the Zener diodes ($Z_1$, $Z_2$, $Z_3$) a recess (31) is provided in the metallizing coating (15) serving as the cover electrode, inside which recess (31) the Zener diodes ($Z_1$, $Z_2$, $Z_3$) are connected with one another by means of metallizing bridges ($B_1$, $B_2$) and inside which recess (31) the last Zener diode ($Z_3$) of the chain ($Z_1$, $Z_2$, $Z_3$) is connected by means of a further metallizing bridge ($B_3$) with a portion of the substrate (10) which has a conductivity type opposite that of the first (11a) and second (11b) zones, preferably with a portion of the stop ring (14), whereupon these metallizing bridges ($B_1$, $B_2$, $B_3$) are bonded via contact windows disposed in the passivation layer (13) to the corresponding regions located therebeneath;

wherein the voltage divider resistor (16a) comprises an ohmic resistor and a chain of Zener diodes ($Z_1$, $Z_2$, $Z_3$) connected in series with the ohmic resistor and with one another.

9. A Darlington transistor circuit as defined by claim 8, characterized in that the voltage divider (16) is calibratable by means of the short-circuiting of individual Zener diodes ($Z_1$, $Z_2$, $Z_3$) in order to adjust the breakdown voltage at the first p-n junction (12a) to a desired value.

10. A Darlington transistor circuit as defined by claim 9, characterized in that the Zeher diodes ($Z_1$, $Z_2$, $Z_3$) are short-circuitable by means of the brief application of a high blocking voltage, combined with a high blocking current.

11. A Darlington transistor circuit as defined by claim 4, characterized in that over a portion of the elongated zone (116a) in the metallizing coating serving as the cover electrode (15), a recess (30) is disposed which exposes the passivation layer (13), that contact windows (301, 302, 303) are introduced into the portion of the passivation layer (13) exposed by the recess (30), which contact windows extend in a row in the longitudinal direction of the elongated zone (116a), that these contact windows (301, 302, 303) are bridged over by a short-circuit metallizing coating (M), which short-circuits the portions of the elongated zone (116a) located between the contact windows (301, 302, 303), and that the voltage divider (16) is calibratable by the splitting off of individual portions ($M_1$, $M_2$) of this short-circuit metallizing coating (M), in order to adjust the breakdown voltage at the first p-n junction (12a) to a desired value.

12. A Darlington transistor circuit as defined by claim 5, characterized in that over a portion of the elongated zone (116a) in the metallizing coating serving as the cover electrode (15), a recess (30) is disposed which exposes the passivation layer (13), that contact windows (301, 302, 303) are introduced into the portion of the passivation layer (13) exposed by the recess (30), which contact windows extend in a row in the longitudinal direction of the elongated zone (116a), that these contact windows (301, 302, 303) are bridged over by a short-circuit metallizing coating (M), which short-circuits the portions of the elongated zone (116a) located between the contact windows (301, 302, 303), and that the voltage divider (16) is calibratable by the splitting off of individual portions ($M_1$, $M_2$) of this short-circuit metallizing coating (M), in order to adjust the breakdown voltage at the first p-n junction (12a) to a desired value.

* * * * *